(12) United States Patent
Sasaoka

(10) Patent No.: US 6,284,042 B1
(45) Date of Patent: Sep. 4, 2001

(54) METHOD OF GROWING NITRIDE CRYSTAL OF GROUP III ELEMENT

(75) Inventor: Chiaki Sasaoka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/605,742

(22) Filed: Jun. 29, 2000

(30) Foreign Application Priority Data

Jun. 29, 1999 (JP) .................................................. 11-183976

(51) Int. Cl.[7] .................................................. C30B 25/02
(52) U.S. Cl. .................................................. 117/104; 117/952
(58) Field of Search .................................. 117/104, 84, 88, 117/952

(56) References Cited

U.S. PATENT DOCUMENTS

| | | | |
|---|---|---|---|
| 5,247,533 | * 9/1993 | Okazaki et al. | 372/45 |
| 5,278,435 | * 1/1994 | Van Hove et al. | 257/184 |
| 5,433,169 | * 7/1995 | Nakamura | 117/102 |
| 5,599,732 | * 2/1997 | Razeghi | 437/105 |
| 5,759,263 | * 6/1998 | Nordell et al. | 117/98 |
| 5,976,398 | * 11/1999 | Yagi | 252/62.3 GA |
| 6,083,812 | * 7/2000 | Summerfelt | 438/481 |
| 6,139,628 | * 10/2000 | Yuri et al. | 117/89 |
| 6,165,812 | * 12/2000 | Ishibashi et al. | 438/46 |
| 6,165,874 | * 12/2000 | Powell et al. | 438/478 |
| 6,177,145 | * 1/2001 | Derderian et al. | 427/535 |
| 6,218,280 | * 4/2001 | Kryliouk et al. | 438/607 |

* cited by examiner

*Primary Examiner*—Felisa Hiteshew
*Assistant Examiner*—Matthew A. Anderson
(74) *Attorney, Agent, or Firm*—Young & Thompson

(57) ABSTRACT

A MOVPE method is provided that makes it possible to grow a high-quality nitride crystal of a group III element. The method comprises the steps (a) to (d). In the step (a), an organometallic compound in a gas phase is supplied to a reaction chamber as a group III component material by a carrier gas. In the step (b), a nitrogen compound in a gas phase is supplied to the chamber as a group V component material by the carrier gas. In the step (c), a hydrocarbon in a gas phase is supplied to the chamber by the carrier gas. In the step (d), the organometallic compound and the nitrogen compound are reacted with each other in a atmosphere containing the hydrocarbon in the chamber to grow a nitride crystal of a group III element on a crystalline substrate. As the hydrocarbon, any hydrocarbon containing at least one carbon-to-carbon (i.e., C—C) bond in its molecule (i.e., alkanes) may be used. Preferably, any hydrocarbon containing at least one double or triple carbon-to-carbon bond (i.e., C=C or C≡C) in its molecule (i.e., alkens or alkynes) is additionally supplied to the chamber. A step of supplying a p- or n-type dopant material to the chamber may be added, in which the nitride crystal exhibits the p- or n-type conductivity.

10 Claims, 3 Drawing Sheets

METHOD OF GROWING NITRIDE CRYSTAL OF GROUP III ELEMENT

BACKGROUND OF THE INVENTION

1. Field of the Invention

The present invention relates to a method of growing a nitride crystal and more particularly, to a method of growing a nitride crystal of a group III element or elements such as gallium (Ga), aluminum (Al), indium (In), and boron (B) which is one of III–V compound semiconductor materials and applicable to light-emitting, cladding, or conductive layers of semiconductor light-emitting elements or devices.

2. Description of the Related Art

In recent years, crystalline nitrides of group III elements such as gallium nitride (GaN) have been attracting a great deal of attention as materials for light-emitting semiconductor elements or devices that emit blue light and high heat-resistant transistors. It is known that GaN bulk crystal is difficult to be grown due to high dissociation pressure of nitrogen (N) and thus, it has been usually produced by using a variety of epitaxial growth methods, such as Metal-Organic Vapor Phase Epitaxy (MOVPE) and Molecular Beam Epitaxy (ME).

In the MOVPE method, typically, trymethylgallium (TMG), trymethylaluminum (TMA), and/or trymethylindium (TMI) is/are used as the group III component material and gaseous ammonia ($NH_3$) is used as the group V component material. TMG, TMA, and/or TMI is/are reacted with $NH_3$ at high temperature to thereby grow epitaxially nitride crystal of Ga, Al, and/or In on a crystalline substrate. The MOVPE method has been forming a main stream in crystal growth methods of producing III–V compound semiconductor materials for light-emitting semiconductor elements or devices such as Light-Emitting Diodes (LEDs) and laser diodes (LDs), because the method generates nitride crystal with desired quality.

Double heterojunction is essential for semiconductor diode lasers, because the active or light-emitting layer needs to be sandwiched by a pair of cladding layers with a lower refractive index than that of the active layer, thereby controlling the mode of light to be emitted. With semiconductor diode lasers using nitride semiconductor materials, typically, the active layer includes a quantum well (QW) structure formed by InGaN sublayers and the pair of cladding layers are made of AlGaN. Moreover, if semiconductor diode lasers are of the current-injection type, they further requires p- or n-type conductive nitride layers serving as current-injection layers and electrode layers in addition to the active layer and the pair of cladding layers. Accordingly, to enhance the light-emitting performance or characteristics of laser diodes, the key is how to grow higher-quality semiconductor layers applicable to the active, cladding, and conductive layers with as good controllability as possible.

In the growing process of AlGaN layers applicable to the cladding layers of laser diodes, it has been known that TMA and TMG as the group III component material react with $NH_3$ as the group V component material. In other words, TMA and TMG cause an undesired intermediate or parasitic reaction with $NH_3$ during the growth process of AlGaN, which was reported by C. H. Chen et al. in Journal of Electronic Materials, Vol. 25, No. 6, 1996, pp. 1004–1008. Thus, high-quality AlGaN layers are difficult to be formed with good reproducibility. This intermediate or parasitic reaction can be understood as a reaction that TMA reacts with $NH_3$ to produce stable adducts and then, these adducts cause a polymerization reaction with TMA and TMG. This understanding was disclosed by Matsumoto et al. in the Technical Report of the Institute of Electronics, Information, and Communications Engineers (IEICE), Vol. 98, No. 384, pp. 45–51.

The intermediate reaction among TMA and TMG and $NH_3$ generates some reaction products with extremely low vapor pressure and therefore, the reaction products tend to be adhered onto the inner walls of the transport or supply tubes or pipes to the substrate on which the AlGaN layers are grown. Thus, there arises a problem that the growth rate of AlGaN is extremely low. Furthermore, because the intermediate reaction is sensitive to the partial pressure of the materials (i.e., TMA and TMG and $NH_3$) and the ambient temperature, there arises another problem that the Al composition of AlGaN crystal varies widely in the growth processes and that the Al composition of AlGaN crystal fluctuates within the substrate or wafer.

The wide variation and fluctuation of the Al composition of AlGaN induces serious problems. For example, the refractive index distribution is disordered in the laser diodes and as a result, the performance such as the threshold current density of laser oscillation degrades. Thus, it is an extremely important problem to suppress the intermediate reaction.

Nitride semiconductor materials of this sort have another problem that conductivity control for p-type GaN and p-type AlGaN crystals is difficult. To produce p-type semiconductor nitride crystal, typically, magnesium (Mg) is doped as a p-type dopant or acceptor. In this case, however, a p-type nitride crystal thus grown is of high electrical resistance and does not exhibit any p-type conductivity. It has been understood that the cause of this phenomenon is that Mg atoms as the acceptor are passivated by hydrogen (H) atoms originated from $NH_3$ as the group V material and/or gaseous hydrogen ($H_2$) as the carrier gas, which was reported by J. A. Van Vechten et al., in the Japanese Journal of Applied Physics, Vol. 31, 1992, pp. 3662–3663.

To prevent the passivation of Mg atoms due to the H atoms, electron-beam irradiation (which was disclosed by H. Amano et al., in the Japanese Journal of Applied Physics Vol. 28, No. 12, 1989, pp. L 2112–L2114) or heat treatment in an inert atmosphere (which was disclosed by S. Nakamura et al., in the Japanese Journal of Applied Physics Vol. 35, 1996, pp. L74–L76) can be performed to reactivate the Mg atoms. The reactivation process by the heat treatment is simple and convenient; however, it has a problem that the surface of a nitride semiconductor layer is damaged by applied heat to thereby increase the contact resistance and that the count of the necessary process steps is increased.

On the other hand, to suppress the passivation of Mg atoms as the acceptor by a carrier gas, gaseous nitrogen ($N_2$) may be substantially used as a carrier gas, which was disclosed in the Japanese Non-Examined Patent Publication No. 10-135575 published in May 1998. In this case, however, if the amount of $H_2$ in the carrier gas is set at zero, there arises a problem that the crystallinity of a nitride semiconductor layer deteriorates. This is due to the fact that $H_2$ in the carrier gas serves as a reducing agent and therefore, it reduces hydrocarbon radicals generated by decomposition of oxygen ($O_2$) in the atmosphere and of organometallic compounds. Moreover, there arises another problem that the effect of the activated H atoms generated by decomposition of $NH_3$ cannot be eliminated and thus, the passivation of Mg atoms due to the H atoms is unable to be suppressed effectively.

SUMMARY OF THE INVENTION

Accordingly, an object of the present invention is to provide a MOVPE method that makes it possible to grow a high-quality nitride crystal of a group III element.

Another object of the present invention is to provide a MOVPE method that suppresses the intermediate or parasitic reaction among an organometallic compound or compounds and NH$_3$ to thereby raise the growth rate of a nitride crystal of a group III element.

Still another object of the present invention is to provide a MOVPE method that removes effectively hydrocarbon radicals generated by decomposition of an organometallic compound or compounds.

A further object of the present invention is to provide a MOVPE method that makes it possible to form a conductive nitride crystal layer of a group III element.

A still further object of the present invention is to provide a MOVPE method that prevents effectively activated hydrogen generated by decomposition of a nitrogen compound or compounds from being incorporated into a nitride crystal of a group III element.

The above objects together with others not specifically mentioned will become clear to those skilled in the art from the following description.

A MOVPE method according to the present invention is a method of growing a nitride crystal of a group III element, which comprises the following steps (a) to (d).
(a) An organometallic compound in a gas phase is supplied to a reaction chamber as a group III component material by a carrier gas.
(b) A nitrogen compound in a gas phase is supplied to the chamber as a group V component material by the carrier gas.
(c) A hydrocarbon in a gas phase is supplied to the chamber by the carrier gas.
(d) The organometallic compound and the nitrogen compound are reacted with each other in an atmosphere containing the hydrocarbon in the chamber to grow a nitride crystal of a group III element on a crystalline substrate.

With the MOVPE method according to the present invention, the gas-phase hydrocarbon supplied to the chamber has a function of suppressing the intermediate or parasitic reaction between the organometallic compound and the nitrogen compound (e.g., NH$_3$) and of eliminating effectively the hydrocarbon radicals generated by decomposition of the organometallic compound. Thus, a high-quality nitride crystal of a group III element or elements can be grown on the substrate at a high growth rate. The high-quality nitride crystal thus grown provides a high-quality conductive layer with sufficient electrical conductivity.

As the hydrocarbon, any hydrocarbon containing at least one carbon-to-carbon (i.e., C—C) bond in its molecule may be used. Specifically, any one of alkanes such as methane (CH$_4$), ethane (C$_2$H$_6$), propane (C$_3$H$_8$), and butane (C$_4$H$_{10}$) may be used.

It is preferred that any hydrocarbon containing at least one double or triple carbon-to-carbon bond (i.e., C═C or C≡C) in its molecule is additionally supplied to the chambers because the hydrocarbon of this sort prevents effectively the active hydrogen generated by decomposition of the nitride component (e.g., NH$_3$) from doping into the nitride crystal thus grown. As a result, when the nitride crystal thus grown is used for a conductive layer doped with an acceptor dopant, there arises an additional advantage that the passivation of the acceptor dopant due to the active hydrogen can be suppressed, thereby further improving the quality of the conductive layer.

As the hydrocarbon containing at least one double or triple carbon-to-carbon bond in its molecule, any one of "alkens", which are expressed as the general formula C$_n$H$_{2n}$ and have a double C—C bond or bonds in its molecule as the functional group, may be used, where n is a natural number. Alternately, any one of "alkynes", which are expressed as the general formula C$_n$H$_{2n-2}$ and have a triple C—C bond or bonds in its molecule as the functional group, may be used.

As the organometallic compound as the group III component material, any organometallic compound or the mixture of any organometallic compounds, which contains a desired group III element or elements such as Ga, Al, In, and B, may be used.

As the nitrogen compound as the group V component material, any nitrogen compound or the mixture of any nitrogen compounds may be used. For example, ammonia (NH$_3$), hydrazine (N$_2$H$_4$), and/or organic hydrazine may be used.

An n-type dopant (i.e., donor) and/or a p-type dopant (i.e., acceptor) may be additionally supplied to the chamber to give the n- or p-type conductivity to the nitride crystal to be grown on the substrate. As the p-type dopant, at least one of Mg, zinc (Zn), and calcium (Ca) may be preferably used. As the n-type dopant, Si and/or germanium (Ge) may be preferably used.

As the carrier gas, gaseous nitrogen (N$_2$), argon (Ar), or hydrogen (H$_2$) is preferably used. The gaseous mixture of at least two of N$_2$, Ar, and H$_2$ may be used.

BRIEF DESCRIPTION OF THE DRAWINGS

In order that the present invention may be readily carried into effect, it will now be described with reference to the accompanying drawings.

DETAILED DESCRIPTION OF THE INVENTION

Figure 1:
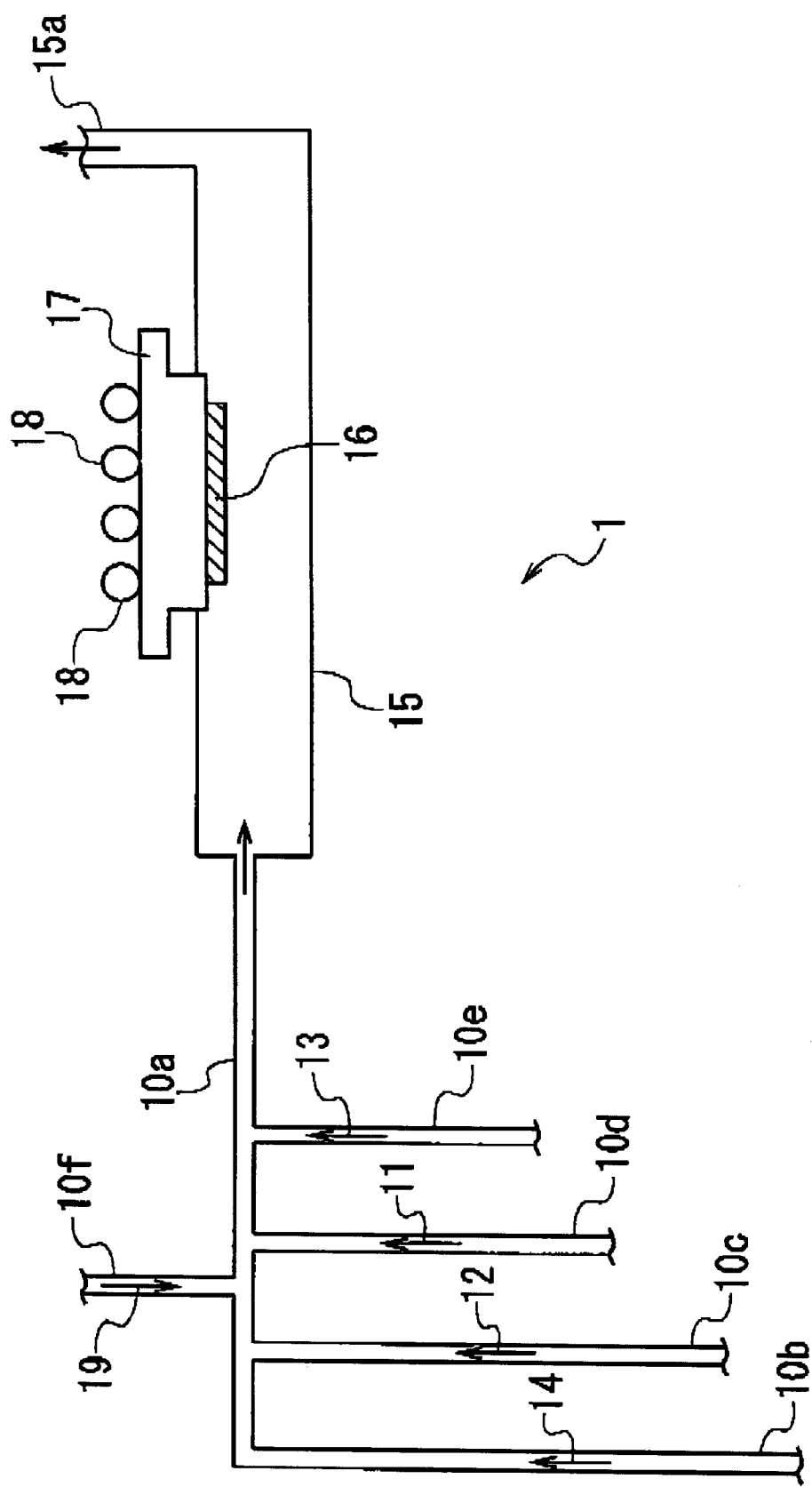
FIG. 1 is a partial, schematic, cross-sectional view showing the structure of a MOVPE apparatus, which is used in the MOVPE methods according to the individual examples of the present invention.

The present invention will be described in more detail below.

As explained previously, the object of the invention is to suppress the intermediate or parasitic reaction between the organometallic compound as the group III component material and NH$_3$ as the group V component material. This object is accomplished in the following way.

The intermediate or parasitic reaction in question is expressed by the following chemical equations (1) and (2).

   (1)

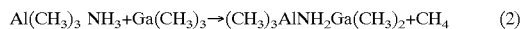   (2)

Through the reactions shown in the equations (1) and (2), an adduct compound [(CH$_3$)$_3$AlNH$_2$Ga(CH$_3$)$_2$] is generated and at the same time, another adduct compound is generated by linking the molecules [(CH$_3$)$_3$AlNH$_2$Ga (CH$_3$)$_2$] in the form of chain. These adduct compounds inhibit the supply of the organometallic compound to the reaction chamber.

However, in the MOVPE method according to the invention, the hydrocarbon additionally supplied to the chamber inhibits the reaction shown by the equation (2) from progressing. Accordingly, the polymerization reaction between the organometallic compound and the adduct compounds can be effectively suppressed.

The object of the invention to effectively eliminate the hydrocarbon radicals generated by decomposition of the organometallic compound is accomplished in the following way.

When TMG is used as the organometallic compound while hydrogen molecules exist in the atmosphere in the reaction chamber, the TMG is decomposed as follows.

$$2Ga(CH_3)_3 + 3H_2 \rightarrow 2Ga + 6CH_4 \quad (3)$$

However, if the carrier gas does not contain hydrogen molecules, the TMG is decomposed according to the following equation (4), thereby generating methane radicals (CH$_3$•).

$$Ga(CH_3)_3 \rightarrow Ga + 3CH_3• \quad (4)$$

The methane radicals (CH$_3$•) thus generated are extremely active and therefore, they tend to adhere onto the substrate. Thus, the growth of the nitride crystal on the substrate is inhibited while the carbon concentration of the nitride crystal is increased due to the doping behavior of the carbon contained in the radicals (CH$_3$•) into the nitride crystal.

Unlike this, when methane (CH$_4$) is additionally supplied to the chamber along with the carrier gas, the methane radicals (CH$_3$•) are turned to stable hydrocarbon atoms according to the following equation (5), which makes it possible to prevent the radicals (CH$_3$•) from adhering onto the substrate.

$$2CH_3• + 2CH_4 \rightarrow 2C_2H_6 + H_2 \quad (5)$$

As a result, even if the atmosphere contains no hydrogen, high-quality nitride crystal can be grown on the substrate.

As seen from the equation (5), to accomplish the object to eliminate the hydrocarbon radicals, any other hydrocarbon than methane may be used. For example, any one of alkanes containing a C—C bond or bonds in its molecule such as ethane (C$_2$H$_6$), propane (C$_3$H$_8$), butane (C$_4$H$_{10}$), may be used. This is because alkanes, which are expressed as the general formula C$_n$H$_{2n+2}$ (n: a natural number), are hydrocarbons with no functional groups.

The object of the invention to effectively eliminate the active hydrogen generated by decomposition of NH$_3$ is accomplished in the following way.

When any one of alkens, which are expressed as the general formula C$_n$H$_{2n}$ and have a C—C double bond or bonds in its molecule, is additionally supplied to the chamber along with the carrier gas, the alken reacts with the active hydrogen to thereby suppress the introduction of the hydrogen into the nitride crystal.

For example, when ethylene (C$_2$H$_4$) is used, the active hydrogen is combined with ethylene according to the following chemical equations (6) and (7).

$$Ga + NH_3 \rightarrow GaN + 3H \quad (6)$$

$$2H + C_2H_4 \rightarrow C_2H_6 \quad (7)$$

Accordingly, the active hydrogen is not introduced into the nitride crystal and as a result, the hydrogen-inducing passivation behavior of the acceptor (i.e., Ga) can be suppressed.

The reaction (7) is caused by the chemical reaction between an unsaturated hydrocarbon (i.e., C$_2$H$_4$) and active hydrogen. Thus, the same effect can be given if any hydrocarbon having a double or triple C—C bond or bonds is used for this purpose. For example, alkenes (C$_n$H$_{2n}$) such as ethylene and propylene and butene, which have a double C—C bond in its molecule as the functional group, or alkynes (C$_n$H$_{2n-2}$) such as acetylene (C$_2$H$_2$) and butene (C$_4$H$_8$), which have a triple C—C bond or bonds in its molecule as the functional group, may be used.

Any one of the hydrocarbons may be used for the respective purposes as described above. However, it is preferred that some of the hydrocarbons are used in combination. In this case, there arises an additional advantage that the above-identified objects can be accomplished simultaneously.

EXAMPLES

The inventors practically performed the MOVPE method according to the invention and conducted some examinations to confirm the advantages of the invention in the following way. Needless to say, the invention is not limited to these examples.

(First Example)

FIG. 1 shows the structure of a MOVPE apparatus used in the MOVPE method according to the first example of the invention.

As shown in FIG. 1, the MOVPE apparatus 1 comprises a quartz reaction tube 15, a carbon susceptor 17 for holding a sapphire substrate 16 on its surface, a heater 18 mounted on the back of the susceptor 17, and gas supply pipes 10$a$, 10$b$, 10$c$, 10$d$, 10$e$, and 10$f$. The tube 15, the susceptor 17, and the heater 18 constitute a horizontal reaction furnace. The substrate 16 is heated by the heater 18 up to desired temperatures.

A carrier gas 14 is supplied to the reaction tube 15 through the pipes 10$b$ and 10$e$. A gaseous compound of nitrogen (i.e., gaseous nitride) 12 is supplied to the tube 15 through the pipes 10$c$ and 10$a$. A gaseous organometallic compound 11 of a group III element or elements is supplied to the tube 15 through the pipes 10$d$ and 10$a$. A gaseous dopant material 13 is supplied to the tube 15 through the pipes 10$e$ and 10$a$. A gaseous hydrocarbon 19 is supplied to the tube 15 through the pipes 10$f$ and 10$a$.

The gaseous compound of nitrogen (i.e., gaseous nitride) 12, the gaseous organometallic compound 11, the gaseous dopant material 13, and the gaseous hydrocarbon 19 are transferred to the inside of the reaction tube 15 by the flowing action of the carrier gas 14 and then, they are chemically reached with each other, thereby forming a nitride crystal of the group III element or elements of the organometallic compound 11 on the (0001) surface of the sapphire substrate 16. During this chemical reaction, the substrate 16 is supported by the susceptor 17 and heated by the heater 18.

The mixture of the gaseous nitride 12, the gaseous organometallic compound 11, the gaseous dopant material 13, and the gaseous hydrocarbon 19 are exhausted through an exhaust port 15$a$ of the reaction tube 15 after specific chemical reactions have occurred.

With the MOVPE method according to the first example, the following process steps were carried out successively while gaseous hydrogen (H$_2$) was used as the carrier gas 14.

First, prior to the growth process of a nitride crystal of the group III element, only a gaseous hydrogen (H$_2$) as the carrier gas 14 was supplied to the reaction tube 15 and then, the sapphire substrate 16 on the susceptor 17 was heated by the heater 18 to 1100° C. in a hydrogen atmosphere, thereby cleaning the substrate 16. Thereafter, the temperature of the substrate 16 was lowered to 500° C.

Next, gaseous TMG as the gaseous organometallic compound, which had been produced by bubbling with nitrogen ($N_2$) gas, was supplied to the tube 15 at a flow rate of 29 µmol/min by the action of the gaseous hydrogen ($H_2$) as the carrier gas 14. At the same time as this, gaseous $NH_3$ as the gaseous nitrogen compound was supplied to the tube 15 at a flow rate of 0.36 mol/min by the action of the $H_2$ gas 14. The pressure in the tube 15 was kept at 700 Torr during the crystal growth process. Thus, a GaN crystal was grown epitaxially on the surface of the substrate 16 to form a low-temperature GaN buffer layer with a thickness of 30 nm.

Subsequently, the temperature of the substrate 16 was raised to 1050° C. and then, the gaseous TMG and the gaseous $NH_3$ were respectively supplied to the tube 15 at flow rates of 58 µmol/min and 0.36 mol/min by the action of the $H_2$ gas 14. Thus, a GaN crystal was grown epitaxially on the low-temperature GaN buffer layer, thereby forming a high-temperature GaN buffer layer with a thickness of 1.5 µm on the low-temperature GaN buffer layer.

To examine the effect of suppressing the intermediate or parasitic reaction by the gaseous hydrocarbon 19, an AlGaN crystal was further grown on the high-temperature GaN buffer layer while methane ($CH_4$) was additionally supplied to the reaction tube 15, thereby forming an AlGaN layer thereon. Specifically, while the temperature of the substrate 16 was kept at 1050° C., a gaseous TMA, the gaseous TMG, and the gaseous $NH_3$ were respectively supplied to the tube 15 at the flow rates of 36 µmol/min, 58 µmol/min, and 0.36 mol/min by the action of the $H_2$ carrier gas 14. The flow rate of the $H_2$ gas 14 was set at 12 litter/min. Thus, an AlGaN layer was formed on the high-temperature GaN buffer layer.

Figure 2:
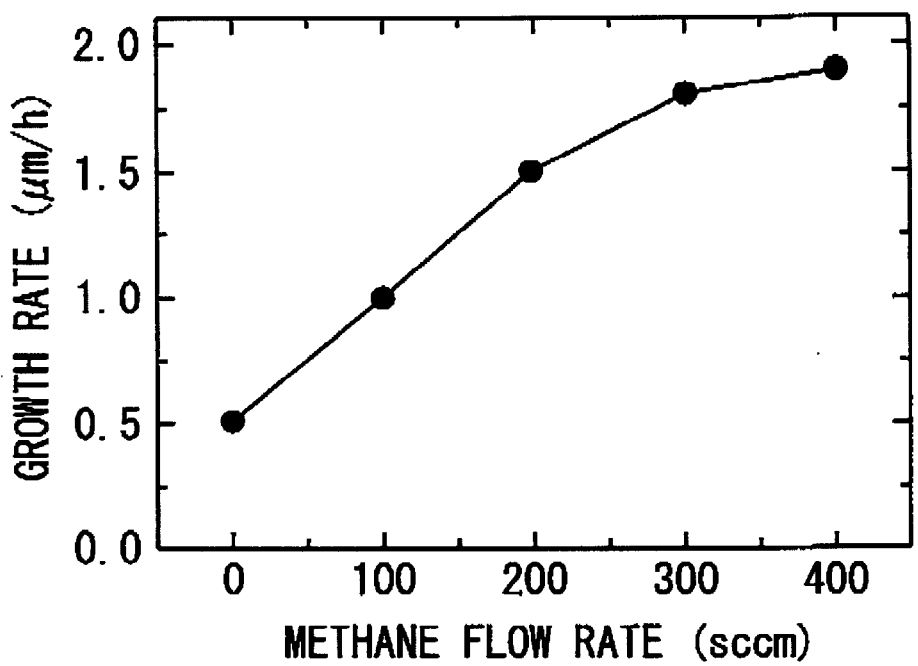
FIG. 2 is a graph showing the dependence of the AlGaN growth rate on the methan flow rate in the MOVPE method according to the first example of the invention.

FIG. 2 shows the dependence of the growth rate of the AlGaN layer thus grown on the flow rate of $CH_4$ in the MOVPE method according to the first example of the invention.

When a GaN layer was grown by using only TMG as the group-III organometallic compound 11 was supplied to the tube 15 without addition of $CH_4$ as the hydrocarbon gas 19, it was observed that the growth rate of the GaN layer was 2.5 µm/h. On the other hand, when an AlGaN layer was grown by using the combination of TMG and TMA as the group-III organometallic compound 11 was supplied to the tube 15 without addition of $CH_4$ as the hydrocarbon gas 19, it was observed that the growth rate of the AlGaN layer was lowered from 2.5 µm/h to 0.5 µm/h.

When $CH_4$ as the hydrocarbon gas 19 was additionally supplied to the tube 15, as seen from FIG. 2, the growth rate of the AlGaN layer was raised from 0.5 µm/h to 1.6 µm/h. The value 1.6 µm/h was given at the flow rate of $CH_4$ being equal to 300 sccm (standard cubic centimeters per minute) or more. It was understood that such the growth rate increase was caused by the fact that the intermediate or parasitic reaction between the TMA and $NH_3$ was effectively suppressed and as a result, the TMG and TMA were efficiently supplied to the vicinity of the substrate 16 for crystal growth.

(Second Example)

In the MOVPE method according to the second example, a high-temperature GaN buffer layer was formed on the sapphire substrate 16 in the same process steps as used in the first example. Next, a GaN layer and an AlGaN layer were successively formed on the high-temperature GaN buffer layer while gaseous nitrogen ($N_2$) was used as the carrier gas 14 and gaseous methane ($CH_4$) was used as the hydrocarbon gas 19. These process steps were carried out to examine the effect of removing or eliminating the hydrocarbon radicals due to the hydrocarbon gas 19.

In the process step of forming the GaN layer on the high-temperature GaN buffer layer, the TMG and $NH_3$ were respectively supplied to the tube 15 at the flow rates of 58 µmol/min and 0.36 mol/min. The gaseous nitrogen ($N_2$) as the carrier gas 14 was supplied at a flow rate of 12 litter/min.

In the process step of forming the AlGaN layer on the GaN layer, the TMG, TMA, and $NH_3$ were respectively supplied to the tube 15 at the flow rates of 58 µmol/min, 36 µmol/min, and 0.36 mol/min. The gaseous nitrogen ($N_2$) as the carrier gas 14 was supplied at a flow rate of 12 litter/min.

Figure 3:
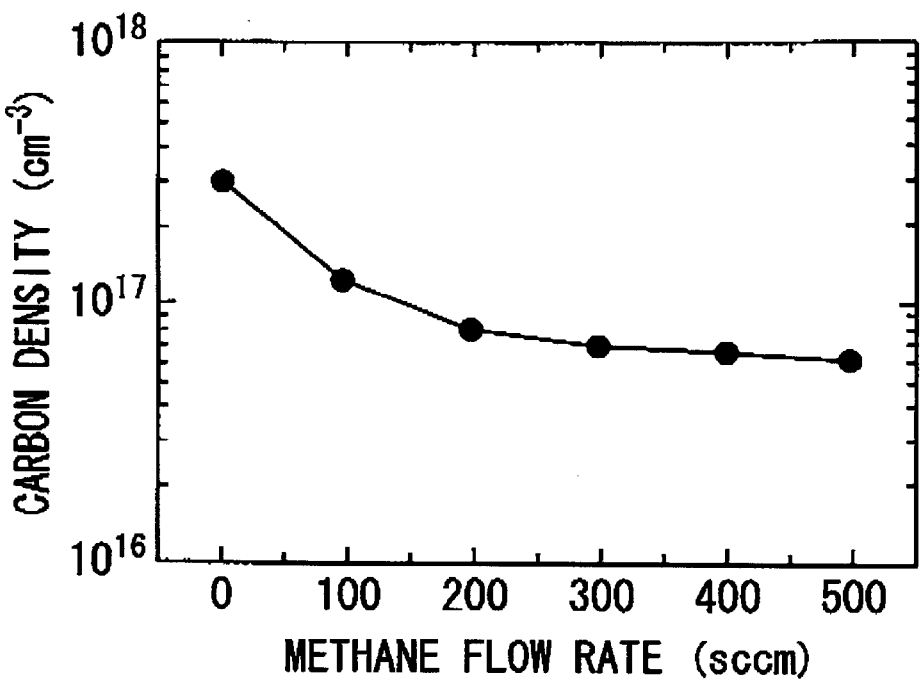
FIG. 3 is a graph showing the dependence of the carbon concentration of the GaN layer on the methan flow rate in the MOVPE method according to the second example of the invention.

FIG. 3 shows the relationship between the flow rate of $CH_4$ and the carbon (C) concentration of the GaN layer in the second example of the invention.

When a GaN layer was grown using $H_2$ as the carrier gas 14, the carbon concentration of the GaN layer was observed at $2 \times 10^{16}$ atoms/cm$^3$. When a GaN layer was grown using $N_2$ as the carrier gas 14 without addition of $CH_4$, it was observed that the C concentration of the GaN layer was raised to $3 \times 10^{17}$ atoms/cm$^3$. The reason of this phenomenon was that the hydrocarbon radicals were not eliminated because $N_2$ was used as the carrier gas 14 instead of $H_2$. On the other hand, when $CH_4$ was additionally supplied to the tube 15 along with the carrier gas 14 of $N_2$, the carbon concentration of the GaN layer was lowered to $6 \times 10^{16}$ atoms/cm$^3$ at the flow rate of $CH_4$ being 500 sccm.

Figure 4:
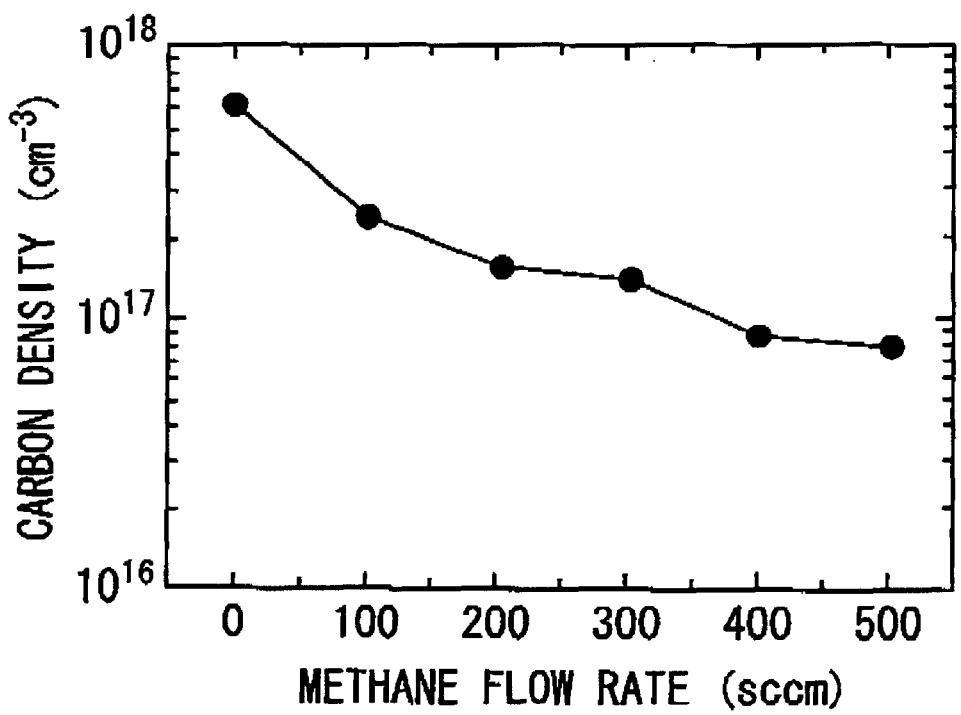
FIG. 4 is a graph showing the dependence of the carbon concentration of the AlGaN layer on the methane flow rate in the MOVPE method according to the second example of the invention.

A similar effect to that shown as above was observed in the process step of forming the AlGaN layer on the GaN layer, as shown in FIG. 4. Specifically, when an AlGaN layer was grown using $N_2$ as the carrier gas 14 along with $CH_4$, it was observed that the C concentration of the AlGaN layer was lowered from $6 \times 10^{17}$ atoms/cm$^3$ to $8 \times 10^{16}$ atoms/cm$^3$. The value of $8 \times 10^{16}$ atoms/cm$^3$ was given at the flow rate of $CH_4$ being 500 sccm.

The curves shown in FIGS. 3 and 4 exhibit the fact that the addition of $CH_4$ as the hydrocarbon gas 19 gives an effect to eliminate the hydrocarbon radicals.

(Third Example)

The inventor found that the GaN and AlGaN layers formed in the second example were high in electrical resistance. Thus, in the third example, to examine the doping characteristic of the n-type dopant into the GaN and AlGaN layers, a high-temperature GaN buffer layer was formed on the sapphire substrate 16 in the same process steps as used in the first example and then, an n-type GaN layer was formed on the high-temperature GaN buffer layer.

In the process step of forming the n-type GaN layer, gaseous mono-silane ($SiH_4$) having a concentration of 10 ppm, which had been produced by dilution with gaseous hydrogen ($H_2$), was used as the n-type gaseous dopant material 13. Methane ($CH_4$) was used as the hydrocarbon gas 19. The flow rates of the TMG, $NH_3$, and $CH_4$ were respectively set at 58 µm/min, 0.36 µm/min, and 300 sccm. The flow rate of the dopant material 13 (i.e., $SiH_4$) was set at 1.2 sccm or 12 sccm.

When the flow rate of the n-type dopant material 13 (i.e., $SiH_4$) was set at 1.2 sccm, the n-type GaN layer had a concentration of the n-type carrier of $1.1 \times 10^{17}$ atoms/cm$^3$ and a mobility of 600 cm$^2$/Vcm. When the flow rate of the dopant material (i.e., $SiH_4$) was set at 12 sccm, the n-type GaN layer had a concentration of the n-type carrier (i.e., donor) of $1.0 \times 10^{18}$ atoms/cm$^3$ and a mobility of 340 cm$^2$/Vcm.

On the other hand, when the flow rate of the dopant material 13 (i.e., $SiH_4$) was set at 1.2 sccm without addition of $CH_4$, the n-type GaN layer had a concentration of the n-type carrier of $0.7\times10^{17}$ atoms/cm$^3$ and a mobility of 400 cm$^2$/Vcm. When the flow rate of the dopant material 13 (i.e., SiH$_4$) was set at 12 sccm without addition of CH$_4$, the n-type GaN layer had a concentration of the n-type carrier of $0.8\times10^{18}$ atoms/cm$^3$ and a mobility of 220 cm$^2$/Vcm. In both of these cases, the n-type GaN layer had a lower concentration of the n-type carrier and a lower mobility than those where CH$_4$ was additionally supplied.

As understood from the above-described result, the addition of CH$_4$ as the hydrocarbon gas 19 improved the conductivity of the n-type GaN layer.

(Fourth Example)

In the fourth example, to examine the effect to suppress the passivation of dopant atoms due to hydrogen, a high-temperature GaN buffer layer was formed on the sapphire substrate 16 in the same process steps as used in the first example and then, a p-type GaN layer doped with Mg was formed on the high-temperature GaN buffer layer.

In the process step of forming the p-type GaN layer, gaseous bis-cyclopentadienyl magnesium (Cp$_2$Mg) was used as the p-type dopant material 13. Gaseous nitrogen (N$_2$) was supplied to a bubbler for the Cp$_2$Mg at a flow rate of 100 cc/min while the bubbler was kept at 30° C., thereby generating gaseous Cp$_2$Mg due to bubbling. The gaseous Cp$_2$Mg thus generated was supplied to the reaction tube 15. As the carrier gas 14, hydrogen (H$_2$) or nitrogen (N$_2$) was used.

When H$_2$ was used as the carrier gas 14, the GaN layer doped with Mg was high in electrical resistance. It was supposed that this phenomenon was caused by the fact that the dopant atoms of Mg were passivated by hydrogen. Next, the CaN layer was annealed in an nitrogen atmosphere for 30 minutes at 800° C. and as a result, the GaN layer exhibited a p-type conductivity. The carrier concentration of the p-type GaN layer was measured by using the Hall effect, resulting in $3\times10^{17}$ atoms/cm$^3$. The Mg concentration of the p-type GaN layer was measured by using the SIMS (Secondary Ion Mass Spectrometer), resulting in $4\times10^{19}$ atoms/cm$^3$.

On the other hand, when N$_2$ was used as the carrier gas 14 instead of H$_2$, the GaN layer doped with Mg exhibited a p-type conductivity. The carrier concentration of the p-type GaN layer was measured in the same method as above, resulting in $9\times10^{16}$ atoms/cm$^3$. The p-type GaN layer was then annealed in an nitrogen atmosphere for 30 minutes at 800° C. and as a result, the carrier concentration of the GaN layer was increased to $6\times10^{17}$ atoms/cm$^3$. The Mg concentration of the p-type GaN layer was measured by using the SIMS, resulting in $4\times10^{19}$ atoms/cm$^3$, which was equal to that of the GaN layer grown by using H$_2$.

It was supposed that the carrier concentration change of the p-type GaN layer due to the annealing process was caused by the following reason. Specifically, when N$_2$ was used as the carrier gas 14, the passivation of the dopant atoms of Mg was not caused. However, active hydrogen was generated due to the decomposition of NH$_3$ and incorporated into the GaN layer, thereby passivating the Mg accepter partially. However, because of the annealing process in the Nitrogen atmosphere, the introduced hydrogen was taken out of the GaN layer and as a result, the carrier concentration was raised.

Figure 5:
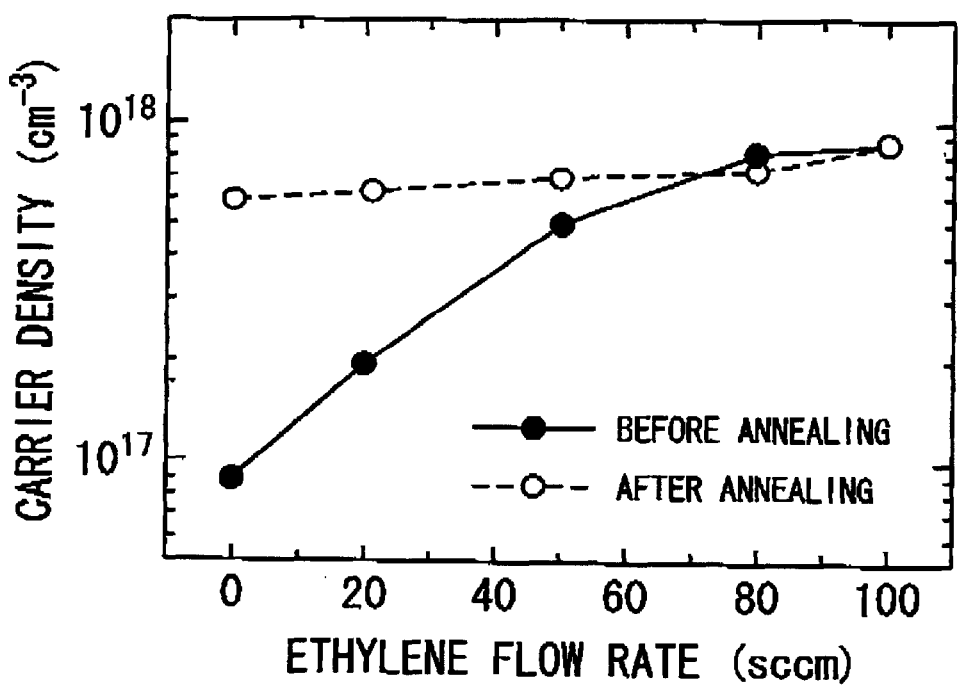
FIG. 5 is a graph showing the dependence of the p-type dopant concentration of the GaN layer on the ethylene flow rate in the MOVPE method according to the fourth example of the invention.

Moreover, when N$_2$ was used as the carrier gas 14 and at the same time, ethylene (C$_2$H$_4$) was used as the hydrocarbon gas 19, the GaN layer doped with Mg had a carrier concentration as shown in FIG. 5.

FIG. 5 shows the dependence of the Mg concentration of the GaN layer on the ethylene (C$_2$H$_4$) flow rate, in which the solid-line curve denotes the carrier concentration just after the growth process (i.e., before the annealing process) and the broken-line curve denotes the carrier concentration after the annealing process. The annealing process was performed in an nitrogen atmosphere for 30 minute at 800° C.

As seen from the solid-line curve in FIG. 5, the carrier concentration of the GaN layer just after the growth process increased as the amount of the added C$_2$H$_4$ gas 19 was increased. The carrier concentration of the GaN layer was $9\times10^{17}$ atoms/cm$^3$ when the flow rate of ethylene was 100 cc/min or higher. Moreover, the carrier concentration of $9\times10^{17}$ atoms/cm$^3$ did not change even after the annealing process. Accordingly, the active hydrogen, which were generated by decomposition of NH$_3$, reacted with C$_2$H$_4$ and thus, it was not introduced into the GaN layer. In other words, the addition of C$_2$H$_4$ (which was a hydrocarbon with a functional group in its molecule) had a function to suppress the passivation of the dopant atoms (i.e., Mg atoms) due to active hydrogen.

(Other Examples)

Mg was used as the p-type dopant in the fourth example. However, any other element may be used for the p-type dopant. For example, when Zn or Ca is used as the p-type dopant, the same result and advantages are observed. Two or more of these elements may be doped simultaneously as the p-type dopant.

Instead of the p-type dopant, any element or elements may be doped as the n-type dopant. For example, when Si or Ge is used as the n-type dopant, the same result and advantages are observed. Two or more of these elements may be doped simultaneously as the n-type dopant.

At least one p-type dopant and at least one n-type dopant may be doped simultaneously.

Nitrogen or hydrogen or the mixture of nitrogen and hydrogen was used as the carrier gas 14 in the above-described first to third examples. However, argon (Ar) or helium (He) or the mixture of Ar and He may be used instead of nitrogen or hydrogen.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A MOVPE method of growing a nitride crystal of a group III element, said method comprising the steps of:
    (a) supplying an organometallic compound in a gas phase to a reaction chamber as a group III component material by a carrier gas;
    (b) supplying a nitrogen compound in a gas phase to said chamber as a group V component material by said carrier gas;
    (c) supplying a hydrocarbon in a gas phase to said chamber by said carrier gas;
    (d) reacting said organometallic compound and said nitrogen compound with each other in an atmosphere containing said hydrocarbon in said chamber to grow a nitride crystal of a group III element or elements on a crystalline substrate.

2. The method according to claim 1, wherein methane (CH$_4$) is used as said hydrocarbon.

3. The method according to claim 1, wherein said hydrocarbon contains at least one carbon-to-carbon (C—C) bond in its molecule.

4. The method according to claim 1, wherein said hydrocarbon contains at least one double or triple carbon-to-carbon (C—C) bond in its molecule.

5. The method according to claim 1, wherein said organometallic compound is a compound of at least one element selected from the group consisting of Ga, Al, In, and B.

6. The method according to claim 1, wherein said nitrogen compound is at least one compound selected from the group consisting of ammonia, inorganic hydrazine, and organic hydrazine.

7. The method according to claim 1, further comprising the step of supplying a p- or n-type dopant material in a gas phase to said chamber, thereby giving a p-type or n-type conductivity to the nitride crystal.

8. The method according to claim 7, wherein at least one selected from the group consisting of magnesium (Mg), zinc (Zn), and calcium (Ca) is used as said p-type dopant.

9. The method according to claim 7, wherein at least one selected from the group consisting of silicon (Si) and germanium (Ge) is used as said n-type dopant.

10. The method according to claim 1, wherein at least one gaseous substance selected from the group consisting of nitrogen ($N_2$), Argon (Ar), helium (He), and hydrogen ($H_2$) is used as said carrier gas.

* * * * *